US006767698B2

(12) United States Patent
Johnson

(10) Patent No.: US 6,767,698 B2
(45) Date of Patent: Jul. 27, 2004

(54) HIGH SPEED STRIPPING FOR DAMAGED PHOTORESIST

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/204,263

(22) PCT Filed: Mar. 20, 2001

(86) PCT No.: PCT/US01/05822

§ 371 (c)(1),
(2), (4) Date: Aug. 20, 2002

(87) PCT Pub. No.: WO01/70517

PCT Pub. Date: Sep. 27, 2001

(65) Prior Publication Data

US 2002/0197870 A1 Dec. 26, 2002

Related U.S. Application Data

(60) Provisional application No. 60/156,595, filed on Sep. 29, 1999.

(51) Int. Cl.$^7$ .......................... G03F 7/42; C03C 15/00; C03C 25/68; C25F 1/00; C25F 3/30
(52) U.S. Cl. .................. 430/329; 134/1.1; 134/1.2; 134/1.3; 216/67
(58) Field of Search .................. 430/329; 134/1.1, 134/1.2, 1.3; 216/67

(56) References Cited

U.S. PATENT DOCUMENTS

| 4,861,424 A | * | 8/1989 | Fujimura et al. ............... 134/1 |
| 5,795,831 A | | 8/1998 | Nakayama et al. |
| 5,811,358 A | | 9/1998 | Tseng et al. |
| 6,461,801 B1 | * | 10/2002 | Wang ........................ 430/329 |

OTHER PUBLICATIONS

Taiwan Office Action issued Nov. 13, 2002 in Taiwanese Patent Application 090106478 (with English translation).

* cited by examiner

*Primary Examiner*—Richard L. Schilling
(74) *Attorney, Agent, or Firm*—Oblon, Spivak, McClelland, Maier & Neustadt, P.C.

(57) ABSTRACT

A method and system (100) for the stripping of photoresist layers using an electrostatically shielded RF (ESRF) plasma for the reduction of a crust and then the removal of the softened photoresist in an ESRF plasma. By varying the temperature during the two steps the method and system further provides the processing parameters for the needs of the stripping reaction.

10 Claims, 8 Drawing Sheets

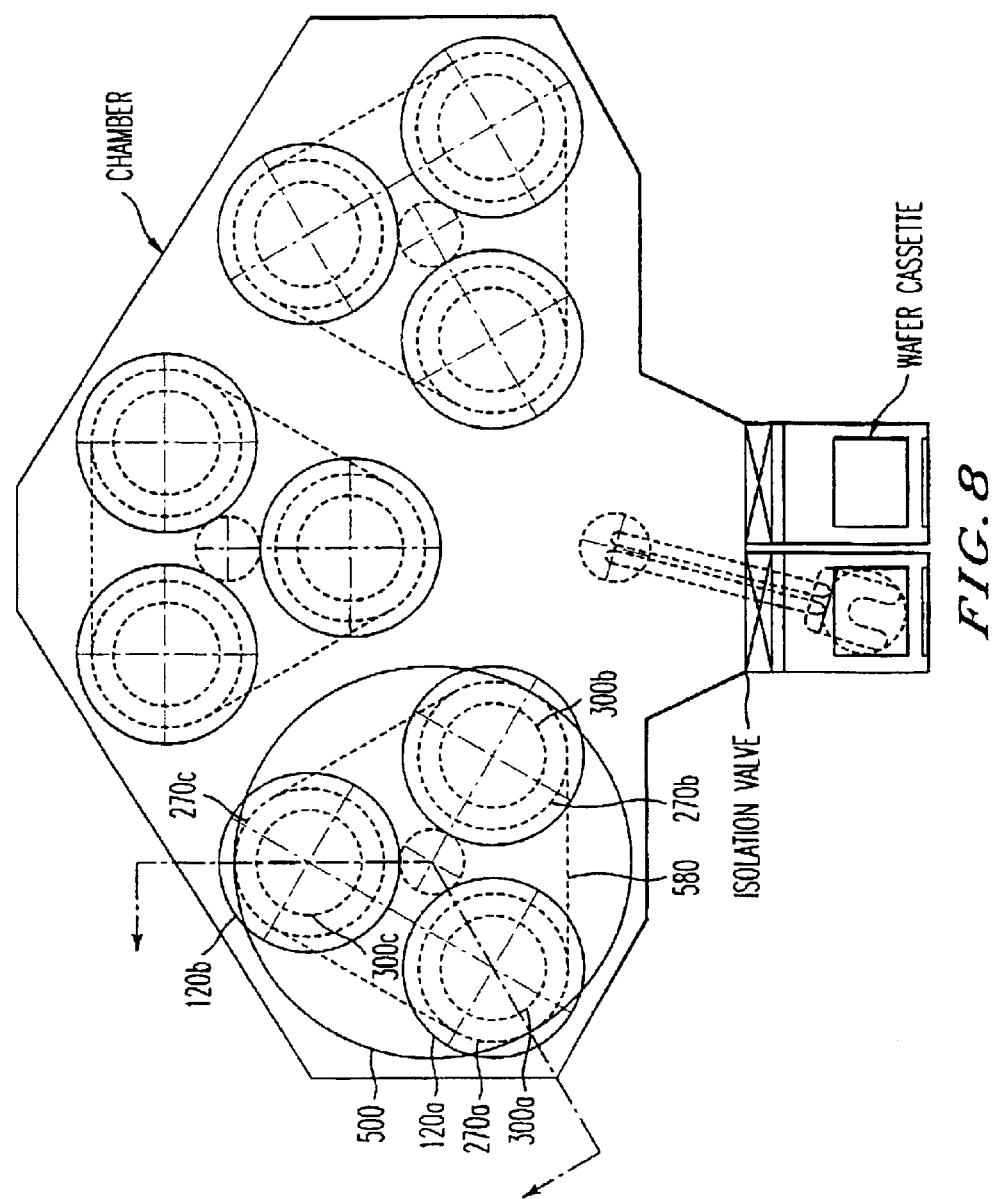

HIGH SPEED STRIPPING FOR DAMAGED PHOTORESIST

CROSS-REFERENCE TO RELATED CO-PENDING APPLICATIONS

This application is related to the following co-pending applications: U.S. Provisional Application No. 60/156,595, entitled "Multi-Zone Resistance Heater", filed Sep. 29, 1999; and PCT application PCT/US 98/23248, entitled "All RF Biasable and/or Surface Temperature Controlled ESRF," filed Nov. 13, 1998. This application is also related to the following two applications filed on even date herewith: Ser. No. 60/190,099 entitled "High Speed Photoresist Stripping Chamber" and Ser. No. 60/190,096 entitled "Chuck Transport Method and System" Each of those four co-pending applications is incorporated herein by reference in its entirety.

BACKGROUND OF THE INVENTION

1. Field of the Invention

The present invention is directed to a method and system for removing ion implanted photoresist, and more particularly to a method and system for effectively stripping a photoresist layer damaged by high dose ion implantation.

2. Discussion of the Background

Photoresist has been used in the fabrication of very large-scale integrated (VLSI) circuits for years. It works as a masking material for shielding ion implantation in selected areas, and transferring patterns into various layers (e.g., oxide, nitride, polysilicon and metals). After ion implantation or pattern transfer is carried out, the photoresist layer needs to be removed completely. Generally, the removal of photoresist, also called stripping or ashing, is performed in a plasma containing (high amounts of) oxygen. The oxygen atoms react with the C (carbon) and H (hydrogen) in the photoresist, forming volatile products that are then exhausted from the system. The requirements of a photoresist stripping process are summarized as: 1) completeness, 2) or minimal or no charge damage, 3) minimal or no contamination, and 4) high throughput. As the device feature size shrinks, those requirements are becoming increasingly stringent.

While non-ion-implanted photoresist can be stripped fairly easily in an oxygenated plasma, it is difficult to completely strip resist that has been damaged by high dose ion implantation by plasma dry etching. During high dose ion implantation, the surface layer of the photoresist is severely damaged or carbonized such that a crust is formed which is difficult to remove. In the case of some plasma dry etching applications, polymers or other materials generated in the process can deposit onto the sidewalls of the photoresist pattern or etched features and form "veils" along the pattern edges that generally require both dry stripping and wet processing to remove. When a conventional oxygen-only process is used, those crust layers or "veils" will be left on the wafer surface as residues after ashing.

As an additional concern, there are many charged particles (ions and electrons) in the plasma discharge. A wafer in the plasma will draw electrons or ions, depending on the RF cycle applied to the plasma and the bias applied to the wafer itself, onto its surface. As electrons have much lower mass and travel at much higher speed, a negative potential will normally be developed on the wafer as a result of surface electron accumulation. If this negative potential is not balanced across the wafer, the resulting potential difference may cause potential differences across the wafer surface and across the thin oxide layers that may exist between the surface conducting layers and the semiconductor substrate. When the potential difference is high enough, it may cause damage, such as charge traps or even dielectric breakdown, in the thin oxide layer. Furthermore, UV radiation generated in the plasma may also create charge traps in oxide layers. As photoresist stripping is used in many steps of the VLSI fabrication process, minimal or no charge or UV damage is allowed, in order to preserve the yield of manufactured devices.

Metallic contents, although minimal, are found in most of the commercial photoresists and developers. Since those metallic contents cannot be removed by oxygen plasma, they will stay on the substrate surface as "residues" at the endpoint of the resist stripping. Overetching, which is commonly required to completely remove the photoresist over the entire wafer, can drive those metallic contents into the films that are present on the wafer surface and result in metallic contamination. Similar phenomena can happen to those ion implanted impurities (e.g., phosphorous and arsenic) as those impurities are oxidized in the oxygen plasma and driven into the surface layers during overetching.

High throughput, one of the critical specifications for any commercial equipment, requires the stripping process to be as short as possible. Besides a reliable, fast and efficient wafer transfer system and pumping system, the resist stripping rate needs to be very high, e.g., >4 mm/min, to achieve high throughput.

Many apparatuses and processes have been developed for removing photoresist from semiconductor wafer surfaces using oxygen plasma discharge. In the conventional method, wafers with resist coatings are simply placed directly in the oxygen plasma generated in a barrel asher. While the throughput of the batch processing in barrel asher is high, charge damage and contamination can result since the ions are in direct contact with the wafers and long overetching times are used.

U.S. Pat. No. 5,478,403 (Shinagawa et al., 1995) introduces an apparatus for resist ashing applications. The apparatus uses a microwave source to generate the oxygen-containing plasma. As shown in FIG. 1, the microwave-generated plasma is introduced to a downstream process chamber, through a plasma-transmitting plate, to where the resist coated wafer is to be treated. While the microwave is efficient in generating oxygen radicals, the ions in the plasma may have high ion energy and cause charge damage and contamination if in direct contact with the wafer surface. Those ions must be eliminated from the flux on their way from the plasma source to the wafer substrate. The transmitting plate captures charged particles in the plasma while allowing the transmission of neutral active species to thereby ash the photoresist coating without accumulating charges on the wafer surface. The wafer is placed on a chuck that is capable of adjusting its position to vary the distance between the wafer and the plasma transmitting plate.

Similar concepts of using microwave-generated plasma in resist stripping can be found in U.S. Pat. No. 5,562,775 (Mihara et al., 1996), U.S. Pat. No. 5,780,395 (Sydansk et al., 1998). U.S. Pat. No. 5,773,201 (Fujimura et al., 1998), and U.S. Pat. No. 5,545,289 (Chen et al., 1996). As described therein, the wafers to be processed are placed downstream from the plasma source chamber. The ions generated by the microwave source recombine on the way to the wafer so that only neutral radicals reach the wafer and affect the ashing process.

In the case of not using a downstream approach the wafer is placed close to the source plasma, and a charge trapping plate or grid is generally used in order to minimize charge damage. The use of a transmitting plate to eliminate the charged particles from reaching the wafer surface is discussed in U.S. Pat. No. 4,859,303 (Kainitsky et al., 1989) and "Advanced photoresist strip with a high pressure ICP source" (Savas et al., Solid State Technology, October 1996, pp. 123–128) (hereinafter "Savas").

The problem of stripping high-dose ion-implanted photoresist, when the above mentioned microwave source and charge-trapping plate are used, is that the oxygen radicals arriving at the wafer surface are not very effective in removing the carbonized crusted skin of the resist coating. During the stripping process, the skin layer tends to crack due to stress and softening of the underlying uncarbonized resist, and the oxygen radicals penetrating through those cracks can react with the underlying "soft" resist at a very high rate. The volatile products generated from ashing the underlying "soft" resist layer will cause the hardened skin layer to crack even further and eventually break into many small pieces. This is generally referred to as "resist popping." Those small pieces of hardened resist skin will stick on the substrate surface and become very difficult to be removed completely by oxygen radicals, even with long overetching time.

U.S. Pat. No. 4,861,424 (Fujimura et al., 1989) (hereinafter "the '424 patent") describes a two-step process designed specifically for stripping ion-implanted photoresist. It uses a plasma containing a mixture of hydrogen and nitrogen in the first processing step and oxygen plasma (or a wet chemical treatment) in the second processing step. In the first step, the hydrogen radicals generated in the plasma react with the carbon in the carbonized resist and the implanted ions (e.g., P, As or B) breaking the bonds joining them. The resulting hydride compounds are volatile, even at room temperature. The fact that the reaction products are volatile at low temperature is particularly important for leaving almost no residue on the substrate since a temperature higher than the softening temperature of un-hardened resist material (about 120°–150° C.) may cause resist popping.

In the '424 patent, the first step is performed in a parallel plate RIE (reactive ion etching) mode reactor and second step in a microwave downstream asher, as shown in FIG. 2. The problem with this approach is that a parallel plate RIE mode reactor has a high electron temperature and high ion energies which may cause charge and lattice damage as well as contamination to the substrate.

U.S. Pat. No. 5,773,201, (Fujimura et al.) describes a process that adds water vapor into oxygen to create the ashing gases. The addition of water vapor lowers the activation energy of the ashing reaction and increases the reaction species, thus increasing the ashing rate and decreasing the process temperature. However, the ashing rate in the disclosure is only about 3000 Å/min.

Savas describes a resist stripping system that utilizes an inductively coupled plasma source with a Faraday shield to reduce RF capacitive coupling to the plasma. The nearly pure inductive coupling nature reduces the plasma potential. The use of high pressure (~1 Torr) and low RF power level (~1 W/cc) produces a plasma with high dissociation and low ionization. Thus this source provides high resist stripping rate but very low charge damage. However, as the ashing of photoresist is purely by chemical reaction, for the ashing rate to be high, the wafer temperature is kept high (e.g., between 200° C.–250° C.). Thus, the system has a potential resist popping problem when used for stripping ion implanted photoresist because of the high wafer temperature. On the other hand, if a low processing temperature is used to prevent resist popping, the ashing rate is compromised, resulting in lower throughput.

In summary, various systems have been developed for stripping photoresist in semiconductor device fabrication. While they are effective in stripping normal resist, most of them have problems when used for stripping ion implanted resist, where a carbonized surface layer is created. Although different apparatuses and processes have been developed to deal with the problem, they suffer from either introducing potential charge and lattice damage in the case of RIE mode asher, or lower throughput in the case of low temperature processing.

SUMMARY OF THE INVENTION

Accordingly, it is an object of the present invention to provide an improved method of stripping ion implanted photoresist.

This and other advantages are made possible by a two step process in which the carbonized surface layer and the underlying soft resist are stripped in two separate steps using different processes in an Electrostatically Shielded RF (ESRF) plasma reactor. The first stripping step uses a combination of radical and controllable low energy ion-assisted etching of the carbonized layer using low processing temperature. The second stripping step uses high concentration oxygen radical ashing to strip the soft resist at a high processing temperature. The ESRF source is able to produce a plasma with adjustable dissociation and ionization rates. When operating at relatively high pressure (e.g., 1 Torr) and low power (e.g., 1 W/cc), it produces high dissociation rate and low ionization rate. The ionization rate increases as the power increases and the pressure decreases.

The combination of the above features makes it possible to strip ion-implanted resist. As most of the RF is coupled into the plasma inductively through the slots in a metallic electrostatic shield (hereinafter "E-shield"), the plasma density decays rapidly below the lower extent of the slots at high pressure. The nature of the pure inductive coupling, when the electrostatic shield is grounded, results in very low plasma potential and very low ion energy. This enables the plasma to be confined to where it is generated. Measurements show that the ion density at a location 25 mm below the source is less than $1 \times 10^8/cm^3$. That means the wafer can be placed very close to the plasma source without causing charge damage. As oxygen radical concentration decays with distance from the plasma source, the closer the wafer is placed to the plasma, the higher the concentration of oxygen radicals arriving at the wafer surface, thus the higher the stripping rate. Another advantage of placing the wafer closer to the plasma source is, when necessary, a small amount of ions can be drawn to the wafer surface to assist the removal of the hardened skin layer.

With the use of a bias shield, the degree of capacitive coupling of the RF power to the plasma, and thus the plasma potential, can be adjusted. When the plasma potential is raised higher, the ion bombardment of the chamber wall and the wafer substrate increases. When the bias level is high, the plasma potential becomes high and ion bombardment to the chamber wall increases. This can be used as a method to clean the chamber inside surface periodically without opening the chamber, resulting in prolonged time between chamber wet clean and higher overall system uptime.

When the bias shield bias level is low, the plasma potential is increased slightly and a small amount of ions, along with radicals, can be introduced to the wafer surface. This phenomenon can be utilized in the first processing step to assist in the removal of the hardened skin layer.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 8 is a top view of a processing system according to a third embodiment of the present invention utilizing three exchangeable chucks.

DESCRIPTION OF THE PREFERRED EMBODIMENTS

Figure 1:
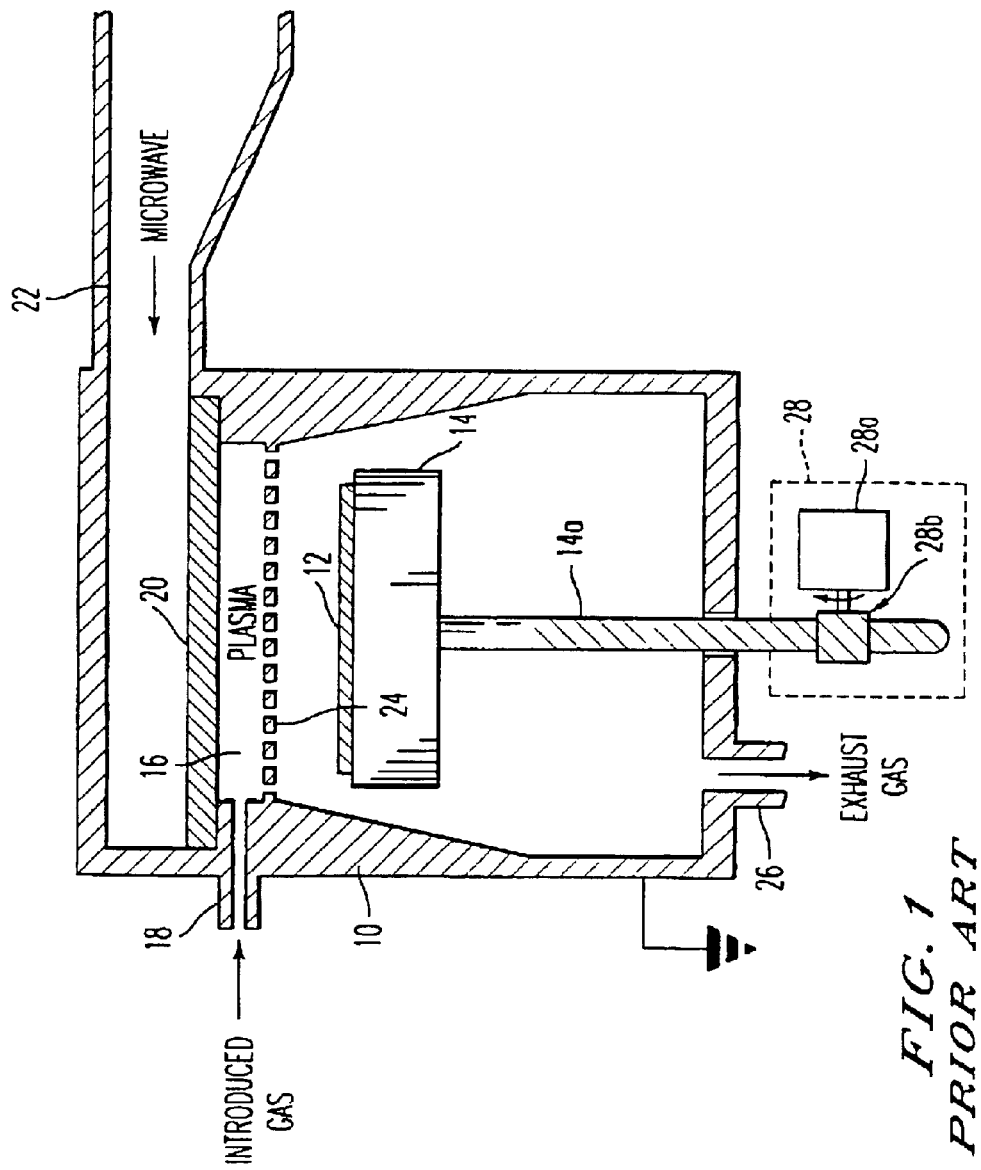
FIG. 1 is a cross-section of a microwave system from U.S. Pat. No. 5,478,403.
Figure 2:
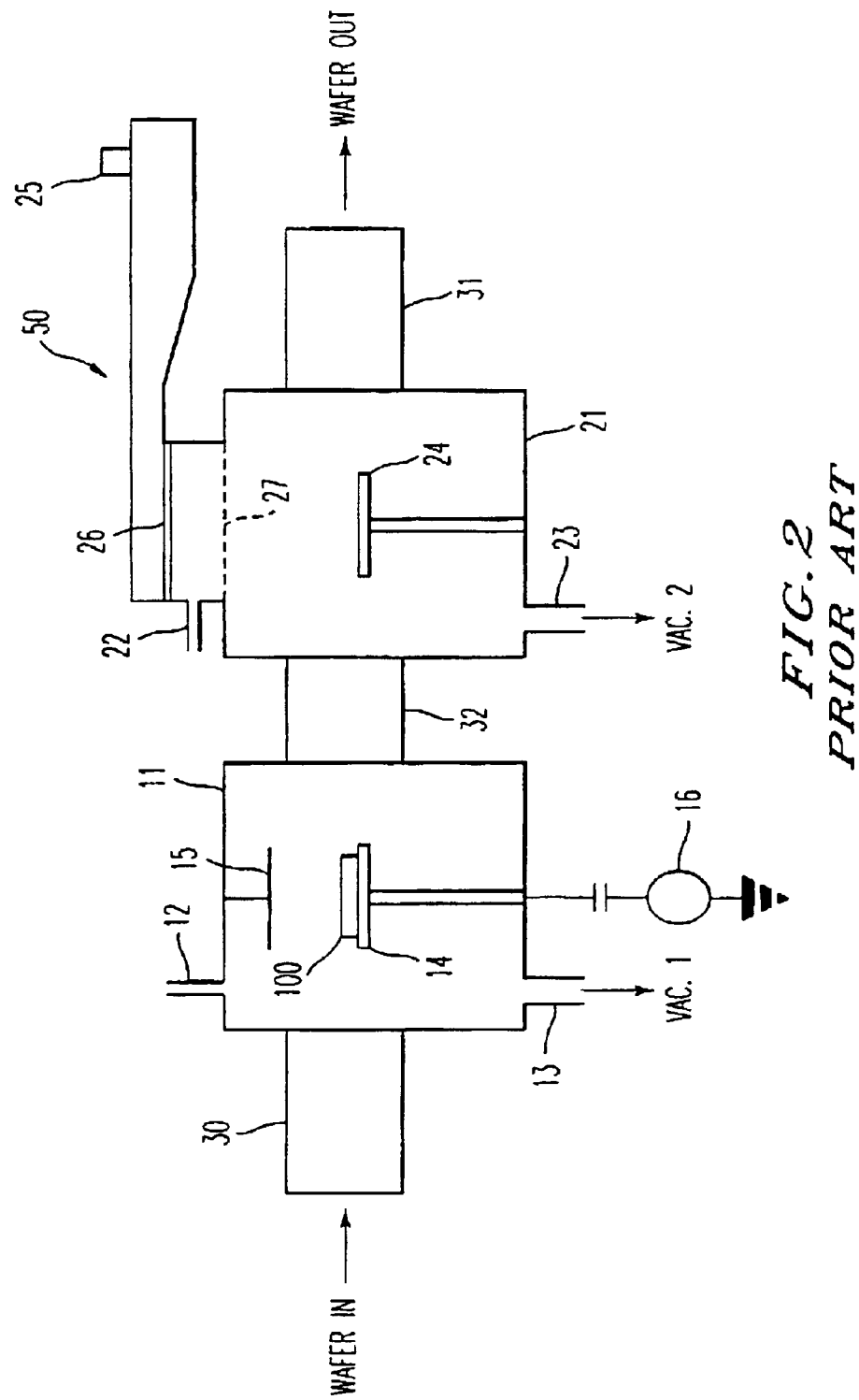
FIG. 2 is schematic illustration of a two-chamber system disclosed in U.S. Pat. No. 4,861,424.
Figure 3:
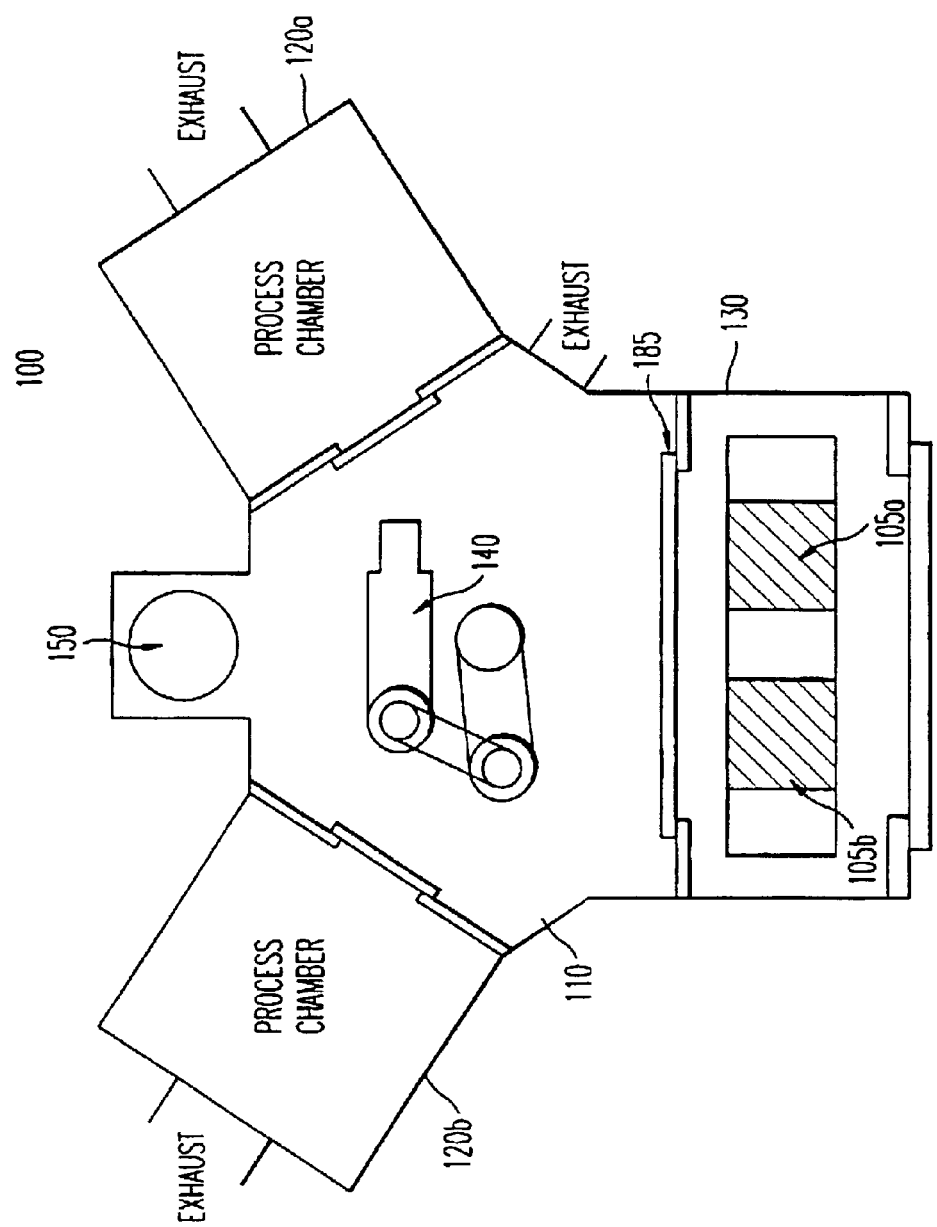
FIG. 3 is a top view of a processing system according to one embodiment of the present invention.

Referring now to the drawings, in which like reference numerals designate identical or corresponding parts throughout the several views. FIG. 3 is a schematic drawing of one embodiment of a plasma processing system 100. The illustrated system includes a loading cassette 105a, an unloading cassette 105b, a load lock chamber 110, at least one processing chamber 120, and a cassette chamber 130. A robotic arm 140 located in the load lock chamber 110 transfers the wafer (not shown) to/from the cassettes 105 and chambers (110, 120 and 130) during the processing cycles. Vacuum pumps (not shown) are installed for each chamber in order to achieve the required vacuum conditions. Nitrogen gas lines (not shown) are connected to the load lock chamber 110 and the cooling chamber 130 for purging and venting purposes. Gas lines for delivering processing gases or liquid vapors are connected to the process chamber(s) 120.

Heating or cooling mechanisms can also be installed in any of the processing, cooling and load lock chambers. For example, in one embodiment of the load lock chamber 110 of the present invention, shown in FIG. 3, an optional preheating chuck 150 is included. Similarly, in an alternate embodiment, if multiple wafers need to be pre-heated simultaneously, multiple pre-heating chucks are included within the load lock chamber 110.

Pumping systems are installed for the load lock chamber and each of the processing chambers. The pumping system for the processing chambers is capable of reaching a pumping speed of >1000 liter/sec. The high pumping speed increases the exchange rate of the reactive species and exhaust of the reaction products, enhancing the ashing process and improving the chamber cleanliness.

In an exemplary use of the system of the present invention, a silicon wafer with damaged resist (e.g., resulting from patterning and ion implantation among other semiconductor device fabrication processes) is first transferred into the load-lock chamber 110. The load-lock chamber 110 is then pumped down to a base pressure in the range of 0–10 mTorr, followed by purging the chamber 110 with an inert gas (e.g., nitrogen) while pumping to maintain the pressure at 200–500 mTorr. The wafer is then transferred to the ESRF process chamber 120 where the two-step resist stripping will take place.

When the optional preheating chuck 150 is installed in the load lock chamber 110 and/or when the multi-chuck rotating arm is used, the wafer is pre-heated to a temperature between 100–150° C. before being transferred into the ESRF process chamber 120. This further shortens the time necessary for the wafer to reach the first process step temperature, therefore increasing the system throughput.

The substrate holder inside the process chamber is normally maintained at an idle temperature of 100–150° C. Although the pre-heat and idle temperatures have been described herein as within the same range, it would be evident to one of ordinary skill in the art that those temperature ranges can be different in an alternate embodiment. During the transportation of the wafer, both the load-lock and the processing chambers are being purged with inert gases (e.g., nitrogen). After the wafer is placed on the process chuck, the chamber is pumped down to base pressure of 0–2 mTorr.

Figure 4:
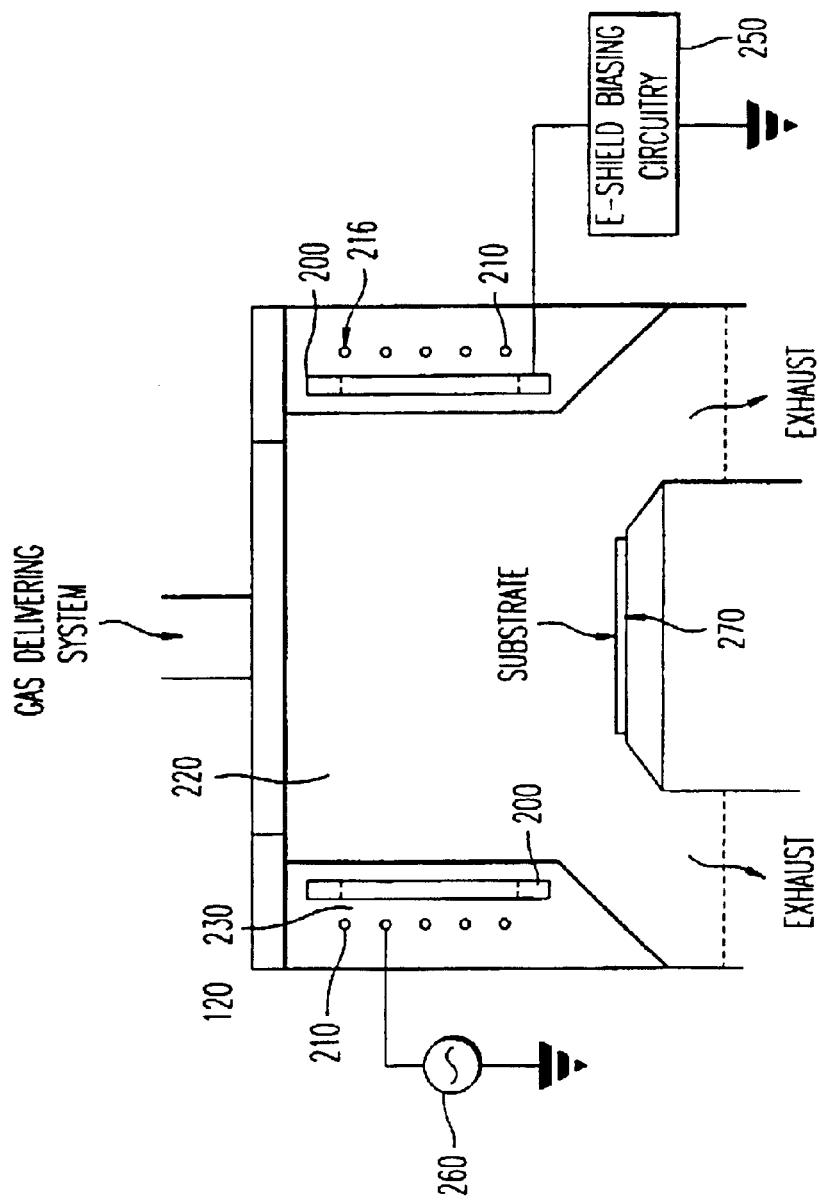
FIG. 4 is a cross-section of one embodiment of an ESFR process chamber of the present invention.

FIG. 4 is a schematic drawing of one embodiment of an ESRF processing chamber 120 according to the invention. ESRF sources are described in U.S. Pat. Nos. 4,938,031 and 5,234,529. According to the present invention, a processing chamber 120 acts as a source plasma generating apparatus and includes a longitudinally slotted, (grounded) metallic E-shield (electrostatic shield) 200 and a longitudinally slotted, (electrically biasable) metallic bias shield 202 disposed within a helical coil 210 and disposed around an internal plasma region 210. A ceramic, insulating wall 230 separates the plasma in the plasma processing region 220 and the coil 210. In general, the bias shield 202 is disposed between the E-shield 200 and the insulating wall 230, wherein the bias shield slots are aligned with the E-shield slots, however, the bias shield slots are typically wider. The E-shield 200 minimizes the capacitive coupling of the coil 210 to the plasma in region 220, while coupling the RF power to the plasma inductively (through a match network 262) from an RF power source 260.

The vertical slits or slots in the E-shield 200 are designed to optimize the relative percentage of capacitively and inductively coupled RF power. The width, length and relative position of the E-shield and its slits (or slots) to the coil are particularly important as they directly affect the plasma property and process performance. To avoid difficulty in initiating plasma, but at the same time keep the plasma potential low, the total area of the slit should be above 0.1%, but less than 10% or tunable in-situ to minimize ions with excess energy. In the preferred embodiment, the area of the slits is between 0.2% and 5%.

As mentioned above, the E-shield 200 is electrically grounded. However, the bias shield 202 is connected to an external biasing circuit 250, comprising an RF venerator 252 and match network 254, wherein the electrical biasing of the bias shield 202 is realized. Additional details of utilizing a bias shield 202, can be found in the PCT patent application entitled "All-Surface Biasable and/or Surface Temperature Controlled Electrostatically-Shielded RF Plasma Source," filed Nov. 13, 1998 (PCT US98/23248).

Figure 5:
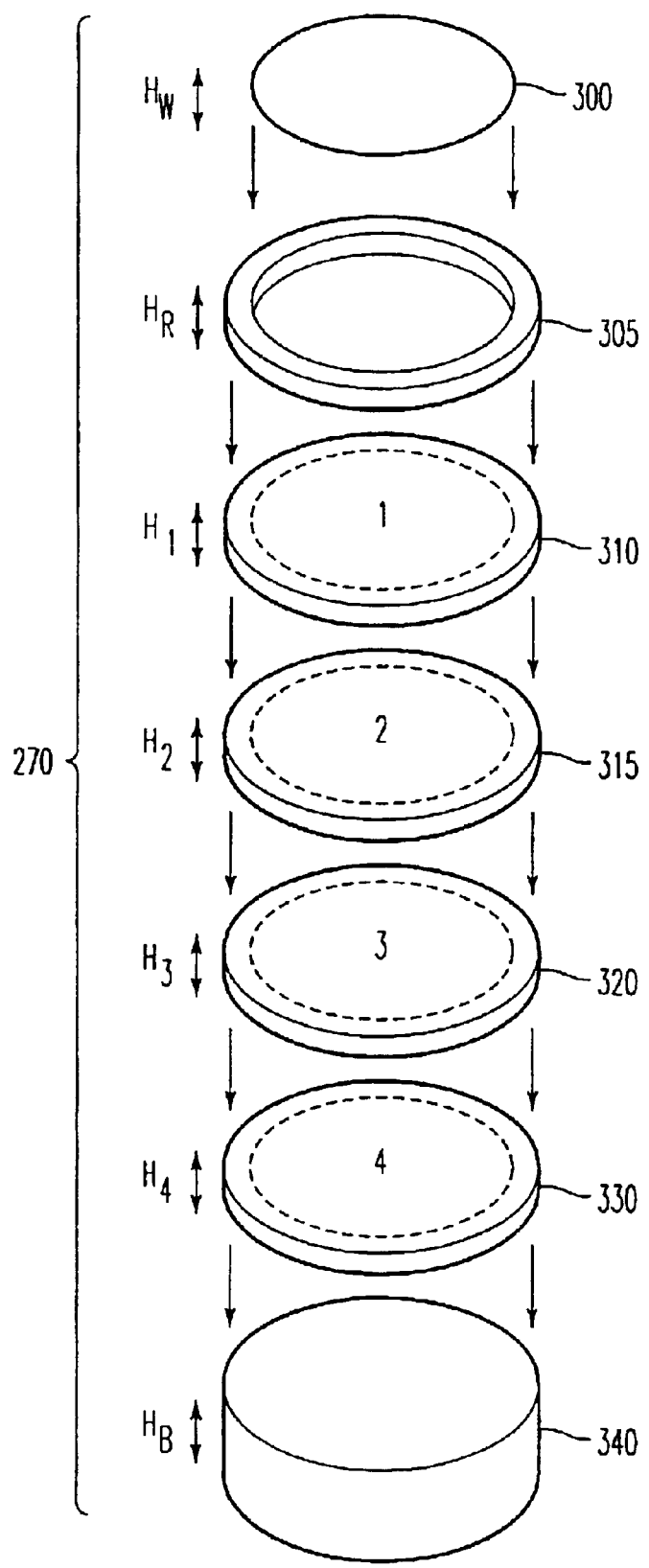
FIG. 5 is a component-view of one embodiment of a chuck for use in the processing system of FIG. 4.

The wafer holder 270, where the wafer is to be placed, is located at a lower portion of the chamber 120 and up to 50 mm below the lower end of the slots in the E-shield 200. FIG. 5 illustrates an embodiment of the wafer holder 270, and a detailed description of that design can be found in provisional application No. 60/156,595, filed Sep. 29, 1999, entitled "Multi-Zone Resistance Heater". The wafer holder 270 includes a focus ring 305, an electrostatic clamping section 310, a He gas distribution system 315, a multizone resistance heater section 320, a multizone cooling system 330, and a base 340. The wafer 300 can be electrostatically clamped onto the holder 270 during processing. He gas is supplied in between the wafer 300 and the holder 270 to provide good thermal conduction. The multizone resistance heater section 320 is used for rapidly heating up the wafer 300 to a desired temperature, and the cooling section 330 is used for rapidly cooling down the wafer to a desired temperature.

As the holder 270 is capable of changing temperatures in a very short time (a few seconds), different temperature settings can be used when stripping ion implanted photoresist within one process. A low temperature setting can be used for stripping the carbonized surface layer to eliminate the resist popping problem, and a high temperature setting can be used to strip the underlying soft resist to increase the stripping rate and overall throughput.

Using the process chamber 120 of FIG. 4, the first process step strips the carbonized skin layer using a process gas or gases (e.g., (1) oxygen, (2) hydrogen, (3) water vapor, (4) mixture of oxygen and nitrogen, (5) mixture of hydrogen and nitrogen, (6) mixture of oxygen and water vapor, and (7) mixture of oxygen, water vapor and nitrogen). The processing gas(es) is/are introduced into the process chamber 120 through the gas delivery system 160 while maintaining the process chamber at between 0.6–1.2 torr. A RF power level of 1–1.5 W/cc is applied on the inductive coil 210 by the RF source 260 to generate the plasma. The bias shield 202 is biased by the bias shield biasing circuitry 250 to generate a negative DC bias level (e.g., 1–20 volts, and preferably 2–10 volts) on the wafer 300 held on the wafer chuck 270. The wafer is processed under this condition for a time period of the first process step (e.g., seconds to minutes). In an alternate embodiment, the wafer is separately negatively biased (due to DC self-bias when biasing with RF) using a biasing voltage source attached to or integrated with the substrate holder 270. In that alternate embodiment, the bias shield 202 biases an edge of the wafer (or other substrate), and the biasing voltage source biases a center of the wafer.

For the second process step to strip the bulk underlying soft resist, the wafer temperature is raised to between 200–250° C. The process chamber is pumped down to a low level, and then suitable gases (e.g., (1) oxygen, (2) a mixture of oxygen and nitrogen, (3) a mixture of oxygen and water vapor, and (4) a mixture of oxygen, water vapor and nitrogen) are introduced into the process chamber 120 while maintaining a pressure of 0.8–1.2 Torr. The RF power applied on the inductive coil 210 is reduced to a level between 0.8–1.2 W/cc to increase the generation of oxygen radicals and reduce the generation of ions. The E-shield 200 is grounded in this step to minimize the plasma potential and number of ions arriving at the surface of the wafer 300.

In an alternate embodiment, an optional third step is added to strip the carbon residues, if any, on the wafer surface. The conditions for this third step are similar to the first process step except that a higher wafer temperature (e.g. 200–250° C.) is used. The low energy ion flux and high wafer temperature help in removal of carbon residues from the wafer surface. Since the ion energy flux is low, minimal or no charge damage and contamination drive-in occurs.

After processing, the wafer 300 is transferred back to the load lock chamber. The wafer 300 may then be moved to another process chamber 120 or through the loading door 185 to the unloading cassette 105b. Cassettes 105 are inserted and removed through the front door 190.

As very little sputtering of the chamber wall by ions in the plasma occurs during the resist stripping process, some of the reaction products may deposited on the surfaces in the chamber and accumulate over time. These depositions, mainly carbon-containing materials, on the chamber surfaces can cause particle problems. Periodical cleaning of the chamber by disassembling the parts and wet cleaning them with certain solvents and water is usually carried out for resist ashers. Wet cleaning procedure is time consuming and sometimes can be a major part of the system downtime. Using the system of the present invention, a dry plasma cleaning process can be implemented to reduce the accumulation of the deposition. This can extend the time between wet cleans and significantly increase the overall system uptime.

To carry out the dry cleaning process, high RF power, >2 W/cc, should be applied on the source coil to generate high-density plasma. A dummy wafer may be placed on the wafer holder 270 to protect the surface of the wafer holder 270. Cleaning gases (e.g., (1) oxygen, (2) oxygen and nitrogen, (3) $NF_3$, (4) oxygen and NF3, and (5) nitrogen and $NF_3$) are introduced into the chamber. The E-shield 200 should be biased to setup a negative bias on the chamber wall (e.g., greater than 100 volts). The high shield bias increases the capacitive coupling of RF power to the plasma, resulting in higher plasma potential. The high plasma potential increases the ion energy flux bombarding the surfaces inside the chamber and enhances the cleaning process.

Accordingly, the apparatuses and processes of the present invention are used to strip ion implantation damaged photoresist, wherein a carbonized skin layer is formed due to high dose ion bombardment. The apparatus uses an electrostatically shielded source to generate the low potential source plasma. The chuck design enables fast temperature change, thus multiple temperature settings are used in the same process. A high speed pumping system is used for increasing the efficiency of exhausting the reaction products and exchange of fresh process gases. The apparatuses and the processes have the advantages of stripping high dose implanted photoresist with (1) substantially complete cleanliness, (2) no or minimal charge damage, (3) no or minimal contamination drive in, and (4) high throughput.

The process uses multiple steps for stripping damaged resist. In the first step, oxygen radicals with small amount of ions are introduced to the wafer surface at a low wafer substrate temperature to strip the hardened skin layer using a biased E-shield. In the second step, oxygen radicals with almost no ions are introduced to the wafer surface at a high substrate temperature to strip the bulk underlying soft resist using a grounded E-shield. In an optional third step, conditions similar to the first step but with a high substrate temperature are used to strip the carbon residues, if any, on the wafer surface.

Figure 6:
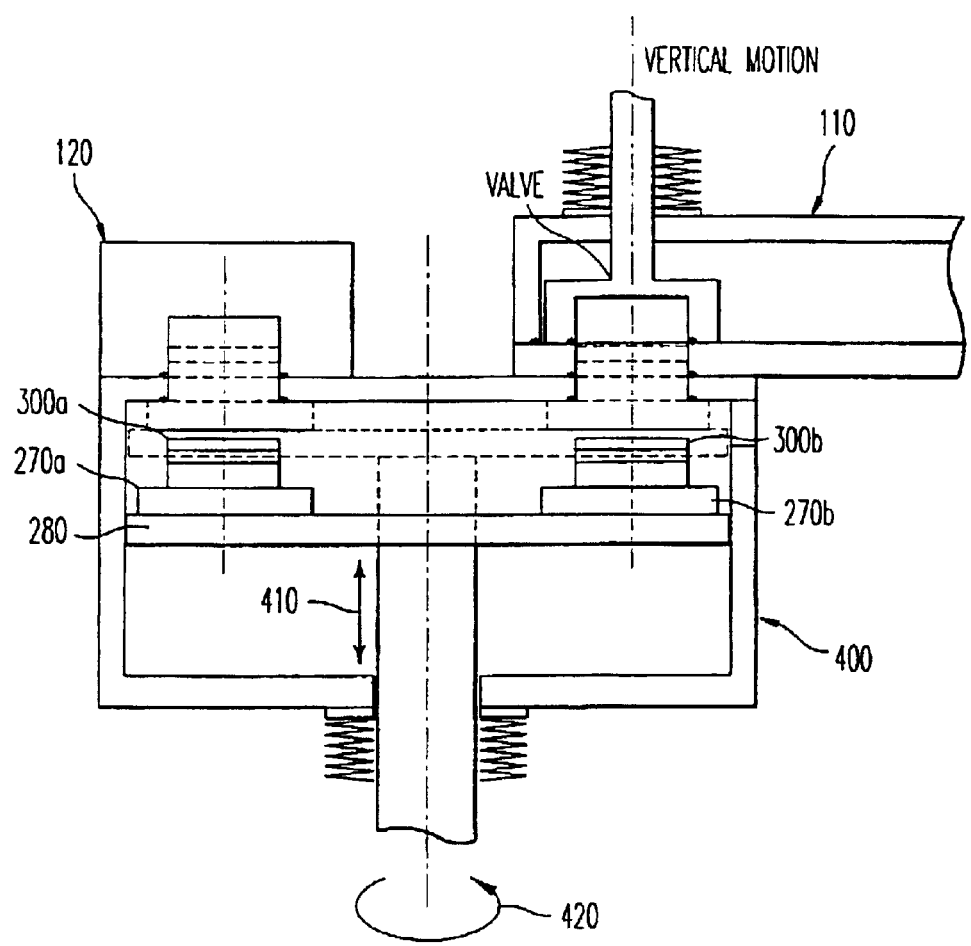
FIG. 6 is a cross-sectional view of a processing system utilizing exchangeable chucks.
Figure 7:
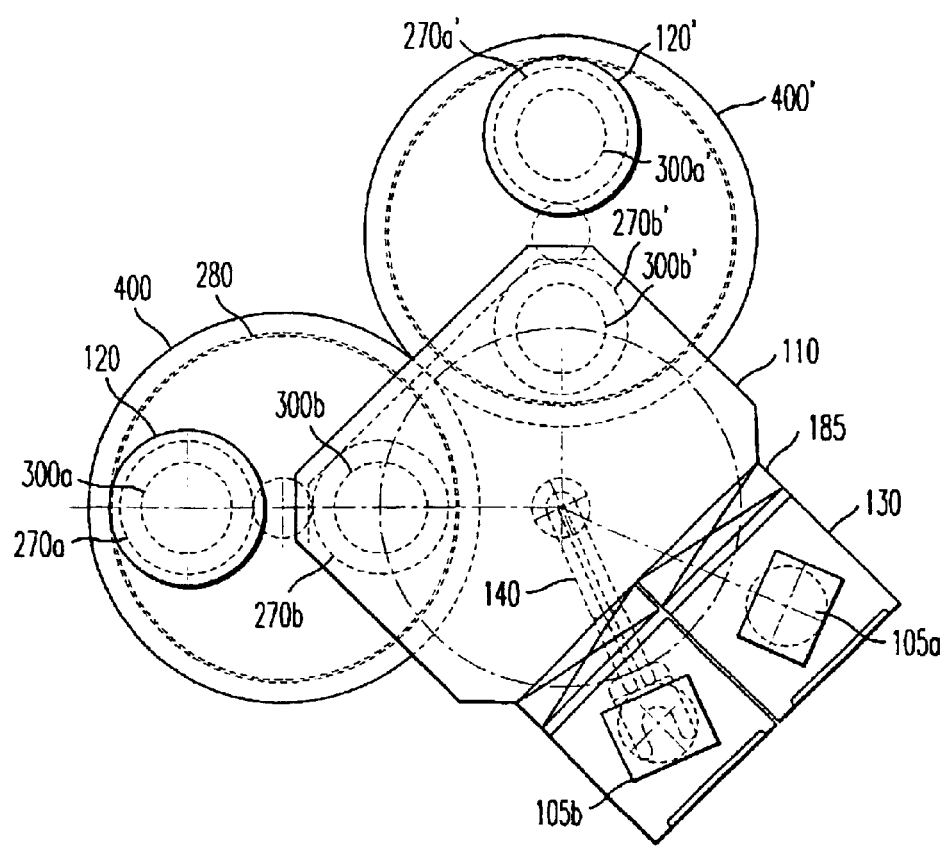
FIG. 7 is a top view of a processing system according to a second embodiment of the present invention utilizing two exchangeable chucks.

In a second embodiment of the invention, an exchangeable chuck arrangement is incorporated in place of the optional pre-heater 150 is incorporated in place of the optional pre-heater 150 as shown in FIG. 6, and described in greater detail in Ser. No. 60/190,096 entitled "Chuck Transport Method and System," filed herewith. FIG. 7 shows a top view of the exchangeable chuck arrangement. Two chucks, 270a and 270b which hold wafers 300a and 300b are situated in chamber 400, and equipped with facilities for both vertical motion 410 and rotary motion 420. The wafer transfer arm 140 initially loads the wafer 300b onto chuck 270b where it is preheated. Once the processing being performed on wafer 300a is completed, the chuck assembly 280 lowers, utilizing vertical motion 410, and then rotates, utilizing rotary motion 420, so that chuck 270b together with wafer 300b are interchanged with chuck 270a and wafer 300a. The chuck assembly 280 then raises 410 so that the chuck 270b and wafer 300b are located in ESRF process chamber 120. The stripping of ion-implanted photoresist on wafer 300b then proceeds as described above. Once the process is complete, the above cycle repeats, the wafer 300b is unloaded by transfer arm 140 and returned to the wafer cassette 105b.

In yet another embodiment, shown in a top view in FIG. 8, a grouping of three chucks 270a 270b and 270c, together with wafers 300a, 300b and 300c, on a triple chuck assembly 580 in chamber 500 is utilized. As with the dual chuck assembly 280, triple chuck assembly 580 is equipped with vertical motion 410 and rotary motion 420. Two ESRF reaction chambers 120a and 120b are provided. These two ESRF chambers are supplied with different chemistries. For example, ESRF chamber 120a could be supplied with the reducing chemistry for reducing the carbonized ion-implanted skin, and ESRF chamber 120b with the oxidizing chemistry for stripping the photoresist. In an exemplary use of the system, a wafer 300b would be loaded on chuck 270b by transfer arm 140 and preheated. When the processes in chambers 120a and 120b are completed, triple process chuck 580 lowers utilizing vertical motion 410, rotates 120 degree utilizing rotary motion 420, and then raises utilizing vertical motion 410 so that wafer 300b is now located in ESRF process chamber 120a. While in ESRF chamber 120a the ion-implanted carbonized crust on the photoresist would be reduced. When the reduction process is completed, the triple process chuck 580 again lowers, rotates 120 degrees and raises, so that wafer 300b is relocated into ESRF chamber 120b. In ESRF chamber 120b may be introduced the oxidizing chemistry for stripping of the photoresist. Once the stripping is complete, the triple process chuck 580 again lowers, rotates 120 degrees and raises again. Wafer 300b, now stripped of ion-implanted photoresist, is ready to be returned to the wafer cassette 105b.

It should be obvious that while the above description followed only wafer 300b, on chuck 270b, wafers 300a and 300c, located on chucks 270a and 270c would be undergoing the same processing, only at different times.

Obviously numerous modifications and variations of the present invention are possible in light of the above teachings. It is therefore to be understood that, within the scope of the appended claims, the invention may be practiced otherwise than as specifically described herein.

What is claimed is:

1. A method of stripping photoresist in a plasma processing system, comprising the steps of:
   (1) reducing a crust on an upper surface of photoresist of a substrate being processed in an ESRF plasma processing system to reveal a softened photoresist layer; and
   (2) stripping the softened photoresist layer in an ESRF plasma after reducing the crust.

2. The method as claimed in claim 1 wherein the step (1) of reducing includes the sub-steps of:
   biasing an electrically biasable bias shield of the plasma processing system with a negative potential; and
   injecting a first processing gas to strip the crust.

3. The method as claimed claim 2 wherein the step (2) of stripping includes the sub-steps of:
   grounding an electrostatic shield, and
   injecting a second processing gas to strip the softened photoresist layer.

4. The method as claimed in claim 2, wherein the sub-step of biasing biases the electrically biasable bias shield with a negative DC potential between 1 and 20 volts.

5. The method as claimed in claim 2, wherein the sub-step of biasing biases the electrically biasable bias shield with a negative DC potential between 2 and 10 volts.

6. The method as claimed in claim 1, wherein the step (2) of stripping further comprising the sub-step of negatively biasing a substrate holder with a voltage between 0 and 20 volts.

7. The method as claimed in claim 1, wherein the step (2) of stripping further comprises the sub-step of heating the substrate to between 100° C. and 150° C., and wherein the step (2) of stripping further comprises the sub-step of heating the substrate to between 200° C. and 250° C.

8. The method as claimed in claim 3, wherein the sub-step of injecting the first gas comprises injecting the first gas to maintain a pressure in a range of 0.6 Torr and 1.2 Torr, and wherein the sub-step of injecting the second gas comprises injecting the second gas to maintain a pressure in a range of 0.8 Torr and 1.2 Torr.

9. The method as claimed in claim 1, further comprising the step of preheating the substrate outside of a plasma processing chamber.

10. The method as claimed in claim 1, further comprising the step of moving substrates between processing chambers using a multiple exchangeable wafer holding assembly.

* * * * *